United States Patent [19]

Chao

[11] Patent Number: 4,727,424
[45] Date of Patent: Feb. 23, 1988

[54] SAMPLED DATA FILTERING SYSTEM, INCLUDING A CROSSBAR SWITCH MATRIX, AS FOR A GHOST CANCELLATION SYSTEM

[75] Inventor: Tzy-Hong Chao, Morrisville, Pa.

[73] Assignee: RCA Corporation, Princeton, N.J.

[21] Appl. No.: 919,494

[22] Filed: Oct. 16, 1986

[51] Int. Cl.⁴ ............................................. H04N 5/213
[52] U.S. Cl. .................................. 358/167; 358/905; 364/724; 455/307
[58] Field of Search ................. 358/167, 166, 160, 36, 358/37, 905; 455/303, 306, 307; 328/167; 333/165, 166; 364/724

[56] References Cited

U.S. PATENT DOCUMENTS

| | | | |
|---|---|---|---|
| 4,127,874 | 11/1978 | Iwasawa | 358/167 |
| 4,314,277 | 2/1982 | Pritchard et al. | 358/167 |
| 4,344,089 | 8/1982 | Utsunomiya et al. | 358/167 |
| 4,388,693 | 6/1983 | Bajatana | 364/724 |
| 4,458,267 | 7/1984 | Dolazza | 358/160 |
| 4,489,342 | 12/1984 | Gollinger et al. | 358/17 |
| 4,542,408 | 9/1985 | Lewis, Jr. | 358/167 |
| 4,584,659 | 4/1986 | Stikvoort | 364/724 |

*Primary Examiner*—Tommy P. Chin
*Attorney, Agent, or Firm*—P. J. Rasmussen; E. P. Herrmann; K. N. Nigon

[57] ABSTRACT

A sampled data filter used in a television automatic ghost cancellation system employs a single chain of cascaded delay elements and a crossbar switch matrix to implement the several different delayed sequences of samples that are used by the system to cancel several ghost signals. The rows of switch elements in the crossbar switch matrix are coupled to the individual delay elements, and the columns of the matrix are coupled to sample scaling circuitry. The scaled samples are summed to develop a psuedo-ghost signal which is combined with the input signal to cancel the ghost signal components.

6 Claims, 4 Drawing Figures

SAMPLED DATA FILTERING SYSTEM, INCLUDING A CROSSBAR SWITCH MATRIX, AS FOR A GHOST CANCELLATION SYSTEM

The present invention concerns a multi-tap sampled data filtering system which uses a crossbar switch matrix to provide programmable tap delays.

In finite impulse response (FIR) and infinite impulse response (IIR) sampled data filtering systems, a sampled data signal is delayed, either through a chain of delay elements having interstitial taps or through multiple parallel delay elements. Delayed signals, taken at selected tap positions or at the output ports of the multiple delay elements, are multiplied by respective filter coefficient values and then added together by summing circuitry. In an FIR filter, the input signal to the filtering system is the signal that is applied to the delay elements, and the output signal is provided by the summing circuitry. In an IIR system, the input signal is added to the signal provided by the summing circuitry to produce the signal that is applied to the delay elements. This signal is also the output signal of the filter.

One type of filtering system has been difficult to implement economically as a sampled data filtering system. This type of filter is best visualized as a relatively long chain of delay elements having a relatively small number of taps which may have variable locations along the chain. A filter of this type may be used, for example, in a system for reducing multipath distortion such as an automatic ghost cancellation system in a television receiver.

In a first type of ghost cancellation filter, the video signal, contaminated by multipath or ghost signals, is delayed by successive stages of a fixed delay line, such as a charge transfer delay device (CTD). At the outputs of the delay line stages, the respective delayed signals are extracted, weighted by filter coefficient values and combined to form a psuedo-ghost signal suitable for canceling the ghost component of the contaminated video signal. In this type of filter there is a tap for every delay element and a filter coefficient multiplier for every tap. However, not all taps contribute to the filtered output signal, only those having non-zero filter coefficient values. A ghost cancellation filter of this type is described, for example, in U.S. Pat. No. 4,344,089 entitled "Ghost Cancelling System", which is hereby incorporated by reference.

A second type of filtering system is shown in the automatic ghost cancellation system of FIG. 1. In this system, contaminated video signals provided by a source 5 are applied to an IIR filter, which includes an adder 12 and an FIR filter 40. The IIR filter is responsive to the contaminated video signal to develop a psuedo-ghost signal having a polarity which is opposite to that of the contaminating ghost signal. This psuedo-ghost signal is added to the contaminated signal in the adder 12 to substantially cancel the ghost signal component of the video signal.

In the exemplary system shown in FIG. 1, up to three ghost signals in the input video signals are detected by a ghost detector 10. The detector 10 sets the amount of time delay provided by each of three variable delay elements 14, 16 and 18 to develop the psuedo-ghost signals for the three detected ghost signals, respectively. The ghost detector 10 also provides a signal to the filter coefficient generating circuitry 20 which, using this signal and the output signal of the adder 12, develops filter coefficient values for three multipliers 22, 24 and 26 coupled to the output ports of the delay elements 14, 16 and 18, respectively. The multipliers appropriately scale and reverse the polarity of the delayed main signal to develop the psuedo-ghost signals. The three psuedo-ghost signals are combined by the adders 28 and 30 to develop the signal which, when applied to the adder 12, cancels the three ghost signals from the input video signals. A ghost signal cancellation system similar to that shown in FIG. 1 is described in U.S. Pat. No. 4,542,408 entitled "Digital Deghosting System", which is hereby incorporated by reference.

In the ghost cancellation system shown in FIG. 1, the sampled data signal provided by the adder 12 is delayed by the three parallel delay elements 14, 16 and 18, the output ports of which may be considered to be the taps of a delay line. The amount of time delay provided by each of the delay elements is variable, thus, the position of each tap on the delay line is variable. To allow full variability of tap position, however, each of the delay elements 14, 16 and 18 should have sufficient memory to allow its associated tap to provide the longest possible time delay. Thus, this system uses three times the memory of the first described system. Even though it uses more memory, this filter configuration is preferred over the first described system for digital ghost cancellation systems because it uses a small number of multipliers, which are relatively complex digital devices.

SUMMARY OF THE INVENTION

The present invention is embodied in a sampled data signal filtering system. The system includes N serially connected delay elements and M sample scaling circuits, where N and M are both integers and M is less than N. A multi-port controllable switching network is configured to couple the output terminals of selected ones of the delay elements to input ports of respectively different ones of the sample scaling circuits.

DETAILED DESCRIPTION

Figure 1:
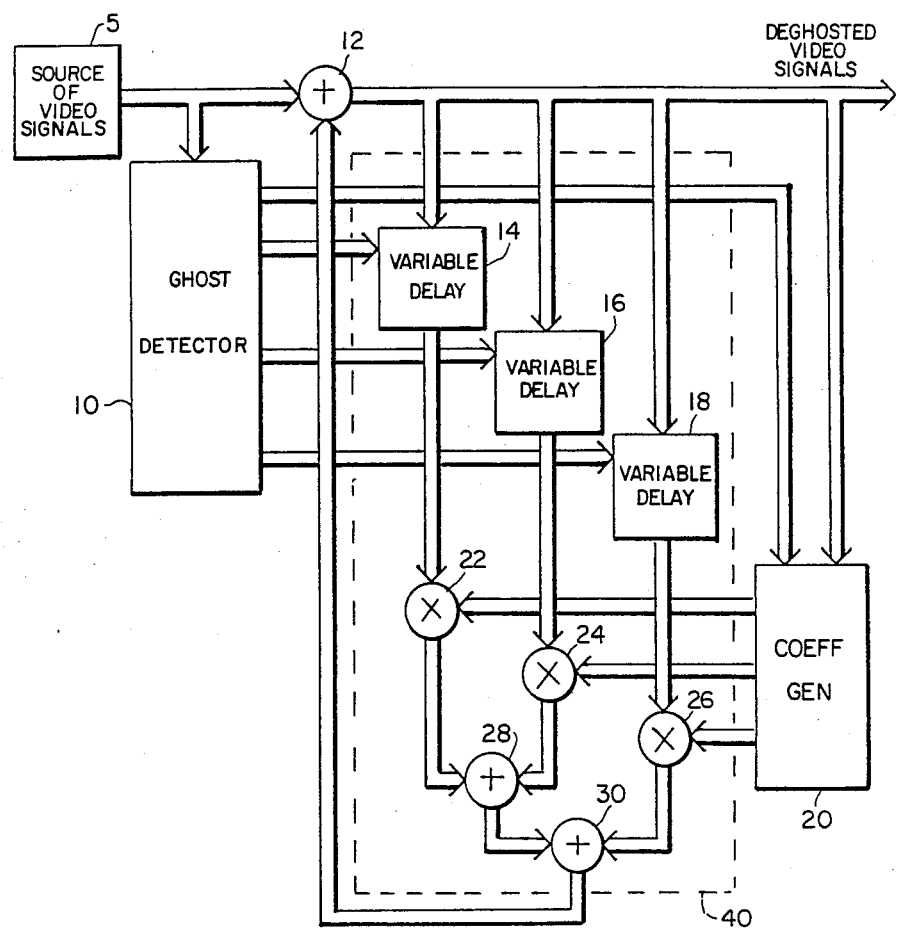
FIG. 1 (prior art) is a block diagram of a ghost cancellation system useful for explaining an environment for using the present invention.

In the drawings, broad arrows represent signal paths, i.e. connections for conveying analog signals or busses for conveying multiple-bit parallel digital signals. Line arrows represent connections for conveying analog signals or single bit digital signals. Depending on the processing speed of the devices, compensating delays may be required in certain of the signal paths and connections. One skilled in the art of digital signal processing circuit design will know where such delays are needed in a particular system.

Figure 2:
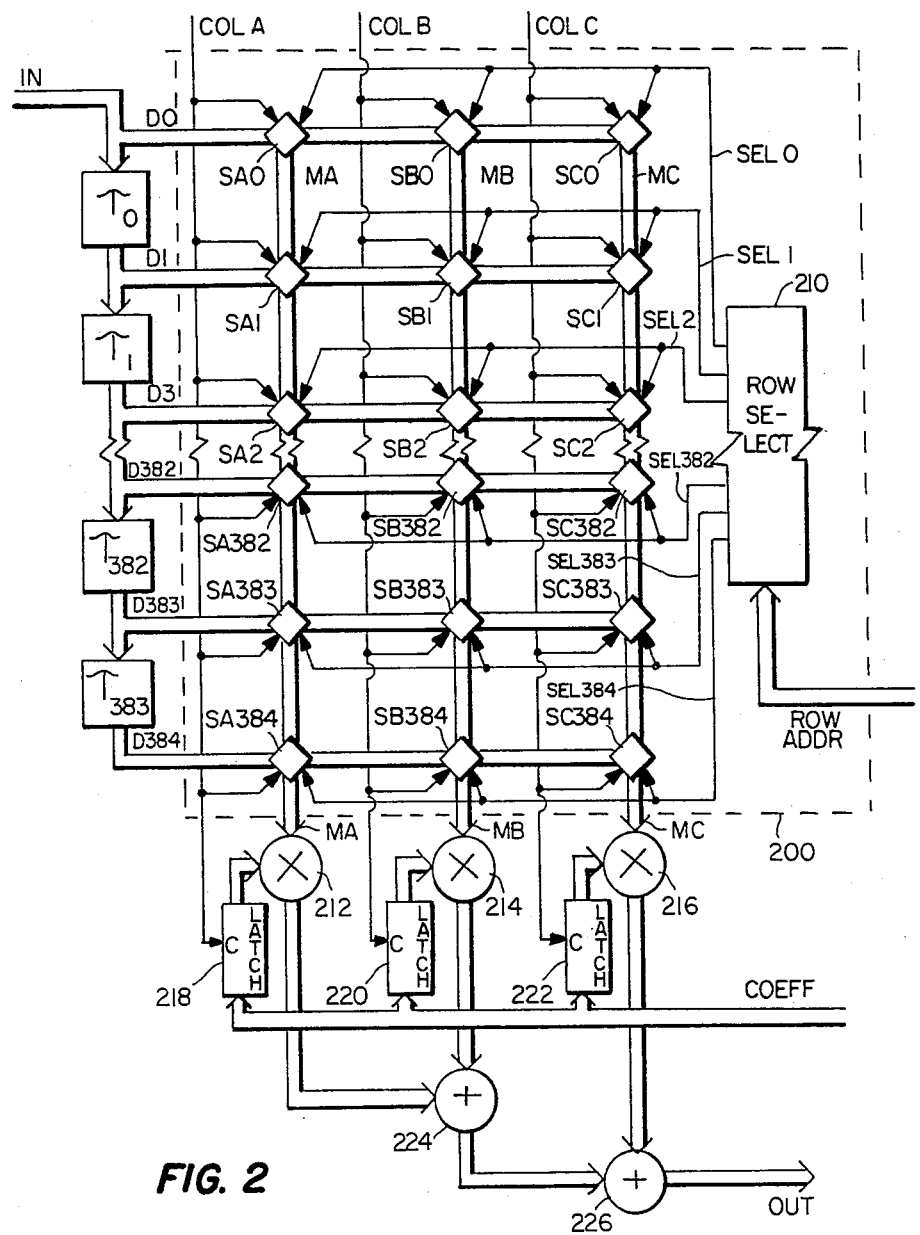
FIG. 2 is a block diagram of a portion of a sampled data filter embodying the present invention.

FIG. 2 is a block diagram of circuitry which may be used in place of the FIR filter 40 shown in FIG. 1. The filter shown in FIG. 2 uses a single chain of delay elements $\tau_0, \tau_1, \ldots \tau_{383}$ and a crossbar switch 200 to realize the same function as the three programmable delay elements 14, 16 and 18, of the system shown in FIG. 1. Each of the delay elements, $\tau_0$ through $\tau_{383}$, delays the samples applied to its input port by a fixed amount of time, for example, one period of the sampling clock signal. The samples applied to the input port of the filter and the samples available at the output port of each of the delay elements $\tau_0$ through $\tau_{383}$ are applied to respectively different input ports of the crossbar switch matrix 200. The samples provided by selected ones of the delay elements are applied to the input terminals of the multipliers 212, 214 and 216 by respectively selected switches in each of the columns of switch elements; SA0 through SA384, SB0 through SB384 and SC0 through SC384. An individual switch element is selected to couple its input samples to its associated output port by one of the signals SEL0 through SEL384, generated by the row select circuitry 210, and by one of the column select signals, C0LA, C0LB and C0LC.

The row select circuitry 210, may, for example, be the same as the address decoding circuitry used in a conventional 512 by 1 bit random access memory (RAM). In response to a signal ROW ADDR, provided by the ghost detector 10, the circuitry 210 activates one of the signals SEL0 through SEL384. When the signal provided by the row select circuitry 210 has stabilized, one of the column select signals, C0LA, C0LB or C0LC, also provided by the ghost detector 10, is pulsed to close the selected switch element.

Figure 3:
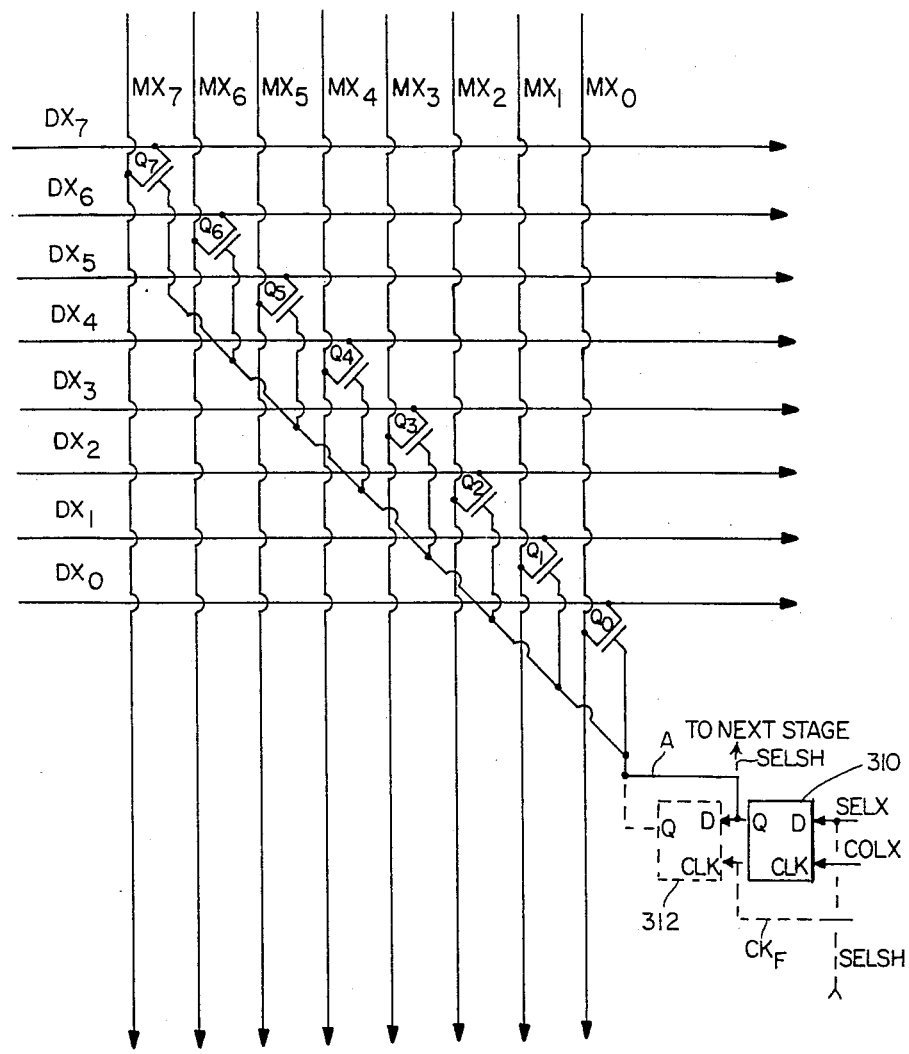
FIGS. 3 and 4 are block diagrams, partially in schematic diagram form, of alternate switching networks which may be used in the sampled data filter shown in FIG. 2.

FIG. 3 is a block diagram of a switch element suitable for use in a parallel-bit digital embodiment of the present invention. In FIG. 3, the output signal path of an arbitrary delay element, $\tau_x$, is shown as eight one-bit connections $DX_0$ through $DX_7$ and the output data path of the switch element is shown as eight one-bit connections $MX_0$ through $MX_7$. Each of the input signal paths is coupled to a corresponding output signal path by an enhancement mode field effect transistor (FET) configured as a transmission gate. The source electrodes of the transistors $Q_0$ through $Q_7$ are connected to the respective input connections $DX_0$ through $DX_7$, and the drain electrodes of the transistors $Q_0$ through $Q_7$ are connected to respective output connections $MX_0$ through $MX_7$. The gate electrodes of the transistors $Q_0$ through $Q_7$ are connected together. In the first embodiment of the invention to be described, the interconnected gate electrodes of the transistors $Q_0$ through $Q_7$ are connected to the output terminal, Q, of a flip-flop 310. The data (D) and clock (CLK) input terminals of the flip-flop 310 are coupled to receive the respective row select signal (SELX) and column select signal (COLX) applied to the switch element. If the signal SELX is a logic zero when the signal COLX is strobed, the signal available at the Q output terminal is a logic zero, the transistors $Q_0$ through $Q_7$ are turned off and the input signal paths $DX_0$ through $DX_7$ are not connected to the output signal paths $MX_0$ through $MX_7$. Conversely, if SELX is a logic one when the signal COLX is strobed, the signal available at the Q output terminal of flip-flop 310 is a logic one and the transistors $Q_0$ through $Q_7$ are turned on, connecting the input signal paths $DX_0$ through $DX_0$ to the respective output signal paths $MX_0$ through $MX_7$.

In the system described above, the switch elements change state one column at a time as each of the three column select signals is strobed. Consequently, while the filter system is changing from its current transfer function to a new transfer function, it may pass through intermediate states in which it exhibits undesirable transfer functions. To prevent this from occurring, a second flip-flop 312 (shown in phantom) may be included in the circuitry for each switching element, in place of the connection A. The flip-flops 310 and 312 are in a master-slave relationship. While the new filter state is being stored in the flip-flop 310, as described above, the flip-flop 312 keeps the system operating in the old state. When the new state is fully established in the flip-flops 310 of all of the switching elements, a clock pulse CKF is simultaneously applied to all of the flip-flops 312, changing the state of the filter to implement the new transfer function.

It is contemplated that the separate row select connections SEL0 through SEL384 may be eliminated by configuring the flip-flops 310 of each column of switch elements as a shift register. In this contemplated embodiment of the invention, the row select circuitry 210 may, for example, include a shift register (not shown) having a number of stages equal to the number of rows of switch elements in the crossbar switch matrix. This shift register may be connected, via a multiplexer, (not shown) to the three column shift registers formed by the interconnected flip-flops 310. In this embodiment of the invention, the shift register stage or sample delay element to be connected to the multiplier input terminal is selected by the row select circuitry and which stores a logic one at the corresponding location in its internal shift register and logic zeroes at all other locations. This shift register is then clocked by the appropriate column select signal to transfer the selected switch states to the corresponding row locations in the appropriate column shift register. A pulse applied to the CKF input terminal of the flip-flop 312 then reconfigures the switch elements to change the transfer function of the filter. In FIG. 3, the interconnection of the flip-flops 310 as a shift register is shown by the phantom signal SELSH which is applied to the D input terminal of the flip-flop 310 and propogated to the flip-flop 310 of the next sequential switch element, as the signal SELSH', via the Q output terminal of the flip-flop 310.

Figure 4:
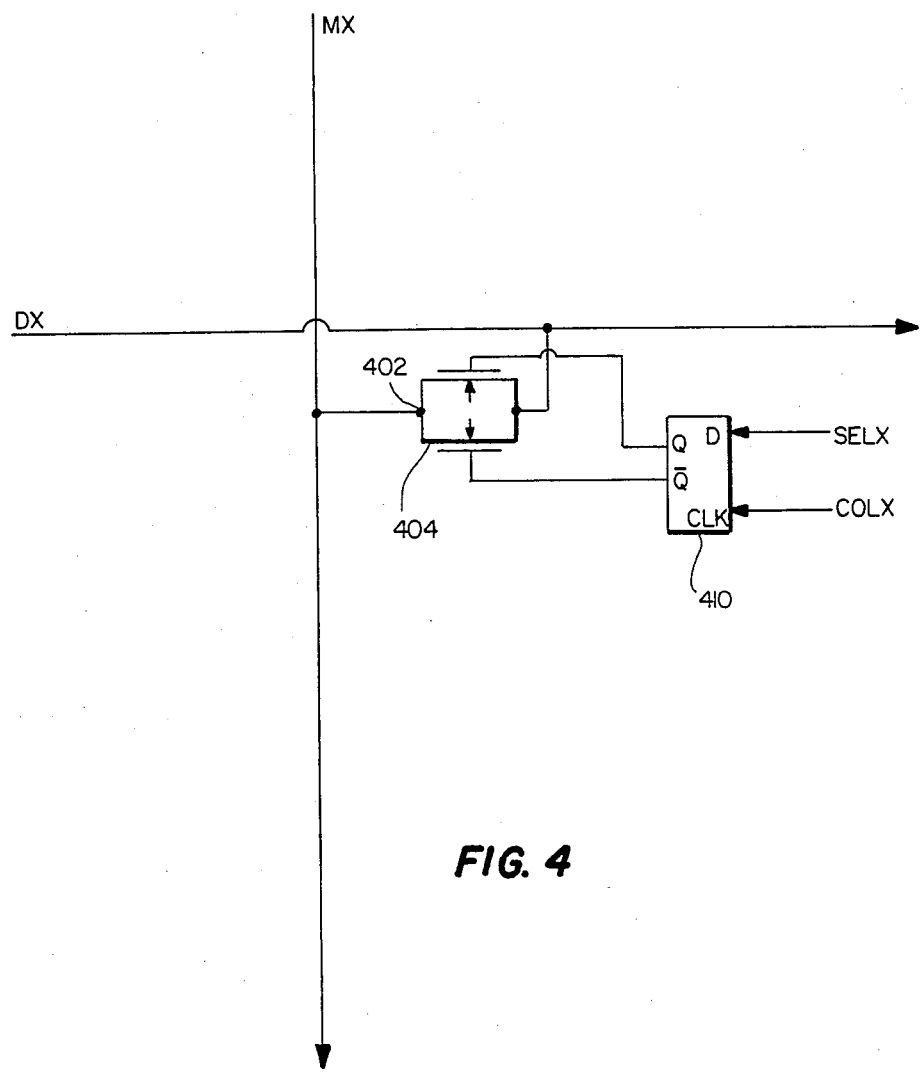

FIG. 4 illustrates an alternative switch element circuit which may be used when the delay elements $\tau_0$ through $\tau_{383}$ are realized using a CTD.

A signal, DX, generated from the charge provided at a tap of the CTD is applied to the interconnected drain and source electrodes of two complementary FET's 402 and 404 respectively. The interconnected source and drain electrodes of the transistors 402 and 404 are connected to the output signal path MX. The gate electrodes of the complementary FET's 402 and 404 are connected to the respective Q and $\overline{Q}$ output terminals of a flip-flop 410. The FET's 402 and 404 are conditioned to conduct when the signals provided by the terminals Q and $\overline{Q}$ are logic one and logic zero, respectively, and conditioned to be non-conducting when the signals at the terminals Q and $\overline{Q}$ are logic zero and logic one, respectively.

The row select signal SELX and column select signal COLX are applied to the respective D and CLK input terminals of the flip-flop 410. As described in reference to the switch element shown in FIG. 3, the row select signal SELX is developed by the row select circuitry 210 and applied to the switch element. This row select signal is stored into the flip-flop 410 when the column select signal, COLX, is strobed. When the signal SELX is a logic zero, the signals at the Q and $\overline{Q}$ output terminals of the flip-flop 410 are logic zero and logic one respectively and both transistors are turned off so the signal path DX is not connected to the signal path MX. When SELX is a logic one, however, the signals at the Q and $\overline{Q}$ output terminals of the flip-flop 410 are logic one and logic zero signals, respectively, and the signal path DX is connected to the signal path MX. The switch configuration shown in FIG. 4 is preferred when analog signals are to be switched since the parallel arrangement of the complementary transistors 402 and 404 allows analog signals to be switched with only insignificant distortion, even when the output data path provides a significant capacitive load.

It is contemplated that the alternative embodiment of the switch element, described in reference to FIG. 3, involving the flip-flop 312 and the configuration of the flip-flop 310 as one stage in a shift register may be used with the switch element shown in FIG. 4. Moreover, it is contemplated that the single FET transmission gates $Q_0$ through $Q_7$ shown in FIG. 3 may be replaced by complementary FET transmission gates identical to the one shown in FIG. 4, or by any other circuitry which realizes a transmission gate function.

Referring to FIG. 2, the signals conveyed by the signal paths MA, MB and MC are multiplied by coefficients, stored in latches 218, 220 and 222, by the respective multipliers 212, 214 and 216. The output signals produced by the multipliers 212 and 214 are summed by an adder 224, the output signal of which is summed with the output signal of the multiplier 216 in the adder 226. The signal provided by the adder 226 is the output signal of the FIR filter.

In the present embodiment of the invention, the filter coefficient values are applied to the latches 218, 220 and 222 via the input signal path COEFF. A coefficient value for a particular column multiplier is applied to the latch input terminals at the same time that row address value for the column is applied to the row select circuitry 210. When the corresponding column select signal is strobed, the coefficient value is loaded into the latch at the same time that the switch state for the column is set. In an embodiment of the invention which uses a CTD for the delay elements, the latches 218, 220 and 222 would be sample-and-hold circuits and the signal path COEFF would provide analog coefficient values.

It is further contemplated that this invention may be practiced in the context of an input weighted sampled data filter. In an input weighted filter the individual delay elements are separated by signal summing circuitry. Input sample values are first weighted by the filter coefficient values and then applied to the input terminals of the summing circuits coupled to selected ones of the cascaded delay elements. At each of the selected delay elements, the weighted samples are summed with the values propogating through the preceding delay elements. The present invention would be realized in this context by placing the crossbar switch between the output terminals of the weighting circuits and the input terminals of the summing circuits between the cascaded delay elements.

A complex filter, either input weighted or output weighted, may be implemented using similar techniques. A complex filter built in accordance with the present invention would have two parallel chains of delay elements, one for the real signal and one for the imaginary signal. In an output-weighted filter, for example, each of the switch elements would couple the samples provided by corresponding stages of the two delay lines to real and imaginary output signal paths. The output signal paths would be connected to complex multipliers which would multiply the real and imaginary signals by real and imaginary coefficient values to produce real and imaginary output values. The real and imaginary signals provided by the complex multipliers would be summed separately to provide the real and imaginary components of the complex output signal.

What is claimed is:

1. A sampled data signal filtering system, comprising:
   an input terminal for applying a sampled data input signal;
   sample delaying means, coupled to said input terminal and having N output terminals for providing, respectively, N sampled data signals representing said sampled data input signal delayed by N respectively different amounts of time, where N is an integer greater than 1;
   M sample scaling circuits, each having an input terminal coupled to receive one of said N sampled data signals, for multiplying said one sampled data signal by a scale factor, where M is an integer greater than 1 and less than N;
   crossbar switching means, coupled to said sample delaying means and to said M sample scaling circuits for coupling selected ones of the N output terminals of said sample delaying means to the input terminals of respectively different ones of said M sample scaling circuits; and
   means coupled to said M sample scaling circuits for summing the respective scaled sampled data signals provided thereby to generate a sampled data output signal.

2. The system set forth in claim 1 wherein, said crossbar switching means comprises:
   a matrix of switch elements having N rows and M columns wherein each row of switch elements in said matrix is coupled to a respectively different one of the N output terminals of said sample delaying means and each column of switch elements in said matrix is coupled to the input terminal of a respectively different one of said M sample scaling circuits; and
   control means, coupled to said matrix of switch elements for selectively enabling one switch element in each of said M columns of switch elements to thereby coupled selected output terminals of said sample delaying means to respectively different ones of said M sample scaling circuits.

3. A sampled data signal filtering system, comprising:
   an input terminal for applying a sampled data input signal;
   sample delaying means, coupled to said input terminal and having N output terminals for providing, respectively, N sampled data signals representing said sampled data input signal delayed by N respectively different amounts of time where N is an integer greater than 1;
   M sample scaling circuits, each having an input terminal coupled to receive one of said N sampled data signals, for multiplying M of said N sampled data signals by M respective scale factors, where M is an integer greater than 1 and less than N;
   a matrix of switch elements having N rows and M columns;
   first and second terminals for applying first and second control signals, respectively;
   means, responsive to said first control signal for providing a first enabling signal to the switch elements in a column of said matrix; and means, responsive to said second control signal for providing a second enabling signal to the switch elements in a column of said matrix;

wherein each switch element in said matrix of switch elements includes:

means, responsive to said first and second enabling signals for storing the value of said first enabling signal in a data storage element on the occurrence of said second enabling signal; and a transmission gate having a principal conduction path between a first electrode, coupled to one of the output terminals of said sample delaying means, and a second electrode, coupled to the input terminal of one of said sample scaling circuits, and having a third electrode which is responsive to the value stored in said data storage element for controlling the conductivity of said principal conduction path.

4. The system set forth in claim 3 wherein said sample delaying means comprises N digital data storage elements, each having an input terminal and an output terminal and being configured as a shift register, wherein each of said N output terminals of said sample delaying means corresponds to a respectively different one of the output terminals of said N digital data storage elements.

5. In a sampled data filtering system, including N serially connected delay elements and M sample scaling circuits where N and M are integers greater than one and M is less than N, circuitry for coupling selected ones of said delay elements to said sample scaling circuits to generate scaled sampled data output signals, comprising:

a matrix of switch elements having N rows and M columns, wherein each row of switch elements in said matrix is coupled to a respectively different one of said delay elements and each column of switch elements in said matrix is coupled to a respectively different one of said sample scaling circuits; and control means, coupled to said matrix of switch elements for selectively enabling one switch element in each column of switch elements to thereby couple the delay elements coupled to the respective selected switch elements to the sample scaling circuits coupled to the respective selected switch elements.

6. The circuitry set forth in claim 5 wherein:

said control means includes:

first and second terminals for applying first and second control signals;

means, responsive to said first control signal, for providing a first enabling signal to the switch elements in a row of said matrix; and means, responsive to said second control signal, for providing a second enabling signal to the switch elements in a column of said matrix; and each switch element in said matrix of switch elements includes:

means, responsive to said first and second enabling signals for storing the value of said first enabling signal in a data storage element on the occurrence of said second enabling signal; and a transmission gate having a principal conduction path between a first electrode, coupled to the output terminal of one of said delay elements, and a second electrode, coupled to the input terminal of one of said sample scaling circuits, and having a third electrode which is responsive to the value stored in said data storage element for controlling the conductivity of said principal conduction path.

* * * * *

UNITED STATES PATENT AND TRADEMARK OFFICE
CERTIFICATE OF CORRECTION

PATENT NO. : 4,727,424

DATED : February 23, 1988

INVENTOR(S) : Tzy-Hong Chao

It is certified that error appears in the above-identified patent and that said Letters Patent is hereby corrected as shown below:

Column 3, line 59 should read "$DX_7$" instead of "$DX_0$"

Column 6, line 45 should read "couple" instead of "coupled"

Column 6, line 68 should read "row" instead of "column"

Signed and Sealed this

Eighth Day of November, 1988

Attest:

DONALD J. QUIGG

*Attesting Officer*  *Commissioner of Patents and Trademarks*